(12) United States Patent
Hathaway et al.

(10) Patent No.: US 10,644,218 B1
(45) Date of Patent: May 5, 2020

(54) MULTICHIP DEVICE WITH TEMPERATURE ISOLATING BUMP BONDS

(71) Applicants: Aaron Ashley Hathaway, Baltimore, MD (US); Robert Miles Young, Ellicott City, MD (US); Patrick Alan Loney, Fairview Park, OH (US); Justin Hackley, Catonsville, MD (US)

(72) Inventors: Aaron Ashley Hathaway, Baltimore, MD (US); Robert Miles Young, Ellicott City, MD (US); Patrick Alan Loney, Fairview Park, OH (US); Justin Hackley, Catonsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/352,512

(22) Filed: Mar. 13, 2019

(51) Int. Cl.
*H01L 39/12* (2006.01)
*H01L 25/04* (2014.01)

(52) U.S. Cl.
CPC .............. *H01L 39/12* (2013.01); *H01L 25/04* (2013.01)

(58) Field of Classification Search
CPC ................................ H01L 39/12; H01L 25/04
See application file for complete search history.

(56) References Cited

U.S. PATENT DOCUMENTS

2019/0103541 A1* 4/2019 Abraham ............ H01L 39/2406
2019/0103542 A1* 4/2019 Abraham ................ H01L 27/18

* cited by examiner

*Primary Examiner* — David Vu
(74) *Attorney, Agent, or Firm* — Tarolli, Sundheim, Covell & Tummino LLP

(57) ABSTRACT

A superconducting structure is provided that comprises a first superconducting device coupled to a second superconducting device employing a plurality of superconducting bump bond structures. Each of the plurality of superconducting bump bond structures comprise a first normal metal layer disposed on the top surface of a given one of a plurality of first contact pads, a second normal metal layer disposed on the top surface of a given one of a plurality of second contact pads, and a superconducting metal layer disposed between the first normal metal layer and the second normal metal layer. The metal thicknesses of each of the first normal metal layer, the second normal metal layer, and the specific material of the superconducting metal and normal metal are selected to inhibit the transfer of heat between the first superconducting device and the second superconducting device.

20 Claims, 3 Drawing Sheets

MULTICHIP DEVICE WITH TEMPERATURE ISOLATING BUMP BONDS

GOVERNMENT INTEREST

The invention was made under Government Contract Number 30078128. Therefore, the U.S. Government has rights to the invention as specified in that contract.

TECHNICAL FIELD

The present invention relates generally to superconductors, and more particularly to a multichip device with temperature isolating bump bonds.

BACKGROUND

"Flip chip" fabrication, also known as controlled collapse chip connection (C4), is a manufacturing method for interconnecting semiconductor devices, such as integrated circuit (IC) chips, to external circuitry with balls of solder, called "bump bonds," deposited onto chip pads on the top side of a first chip near the end of a wafer process used to fabricate the first chip. To mount the first chip to external circuitry (e.g., a circuit board or a second chip or wafer), the first chip is flipped over so that what was initially its top side during its own fabrication faces down, and then is aligned so that its pads align with matching pads on the external circuitry. Flip chip fabrication stands in contrast to wire bonding, in which a chip is mounted upright and wires are used to interconnect the chip pads to external circuitry. Flip chip processes are used in making traditional CMOS devices, and now also in the construction of superconducting circuit devices that typically operate in refrigerated cold spaces.

SUMMARY

In one example, a superconducting structure is provided that comprises a first superconducting device having a plurality of first contact pads disposed on a top side of a first superconducting device, a second superconducting device having a plurality of second contact pads disposed on a bottom side of a second superconducting device, and a plurality of superconducting bump bond structures with a given superconducting bump bond structure coupling respective contact pads of the plurality of first contact pads and the plurality of second contact pads to one another to bond the first superconducting device to the second superconducting device. Each of the plurality of superconducting bump bond structures comprise a first normal metal layer disposed on the top surface of a given one of the plurality of first contact pads, a second normal metal layer disposed on the top surface of a given one of the plurality of second contact pads, and a superconducting metal layer disposed between the first normal metal layer and the second normal metal layer. The metal thicknesses of each of the first normal metal layer, the second normal metal layer, and the specific material of the superconducting metal and normal metal are selected to inhibit the transfer of heat between the first superconducting device and the second superconducting device.

In another example, a superconducting structure comprises a first superconducting device having a plurality of first contact pads disposed on a top side of a first superconducting device, a second superconducting device having a plurality of second contact pads disposed on a bottom side of a second superconducting device, and a plurality of superconducting bump bond structures with a given superconducting bump bond structure coupling respective contact pads of the plurality of first contact pads and the plurality of second contact pads to one another to bond the first superconducting device to the second superconducting device. Each of the plurality of superconducting bump bond structures comprises a plurality of normal metal layers and a plurality of superconducting metal layers interleaved with one another wherein the metal thicknesses of each of the plurality of normal metal layers and the plurality of superconducting metal layers are selected to have a thickness of greater or equal to two coherence lengths of the superconducting metal.

DETAILED DESCRIPTION

Figure 1:
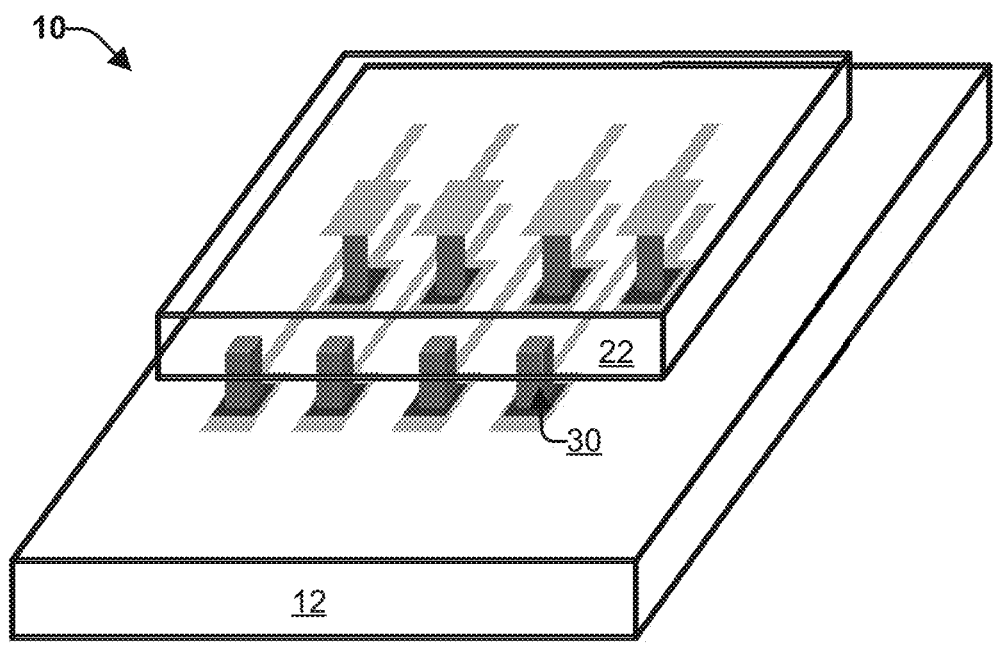
FIG. 1 illustrates a perspective view of a Chip-on-Chip superconducting structure.

The disclosure relates to the forming of superconducting structures from two or more superconducting devices. The two or more superconducting devices can be electrically and mechanically coupled to one another via bump bond structures. The bump bond structures are formed from a bump bonding process that achieves a superconducting interconnect between superconducting devices, such as for flip chip integration. In particular, a fabrication process is described herein to generate a superconducting bump bond structure that acts also as a thermal isolator between the chips by utilizing a superconducting bump bond structure of interleaving superconducting and normal metal layers. Normal metals are metals that do not superconduct, or metals that do not superconduct above certain operating temperatures. Furthermore, the superconducting metal material and the normal metal material can be selected to provide a good thermal boundary resistance at each normal metal layer and superconducting material layer interface to inhibit the flow of heat. The selected materials will be based on achieving a desired differential between the speeds of sound of the materials to achieve a desired thermal boundary resistance to block the travel of phonons (heat carrying vibrations).

In one example, the thickness of each superconducting metal layer and each normal metal layer is selected to be at least 2 superconducting coherence lengths 4 of the selected superconducting metal. This is to assure that the normal metal layers do not proximitize and behave as a superconductor at very thin thicknesses. Furthermore, the presence of a normal metal in contact with a superconductor can reduce or even eliminate the superconducting gap, this is known as the inverse-proximity effect. This only occurs for a short distance near the interface, as determined by the superconducting coherence length 4. Therefore, the superconductor metal layers also need a thickness of at least 2 superconducting coherence lengths to maintain their superconducting properties. For example, the coherence length in niobium (Nb) is quite small ~48 nm, while Aluminum (Al) has a larger coherence length ~1600 nm. To insure maintenance of a superconducting state in an normal metal—superconducting metal—normal metal (NSN) stack then the superconductor should be several coherence lengths thick. In one example, the coherence length has been selected to be about 2ξ to about 5ξ.

In yet another example, the thickness of each superconducting metal layer and each normal metal layer is selected to be a quarter-wavelength or integer number of wavelengths plus one quarter-wavelength of the phonon dominant wavelength of each given layer based on the metal material and its respective expected operating temperature during normal operation of the bonded devices to facilitate temperature isolation between the bonded devices. Phonons are quantized lattice vibrations that carry the heat in superconductors, and partially carry heat in normal metals. Normal metals will also carry heat by electrons (hot electrons). Each time the heat encounters a superconductor layer, the heat only is carried by phonons as vibrations. The vibrations have a dominant wavelength based on the specific material and its current temperature.

The phonon dominant wavelength approximation is based on the premise that at any temperature the heat is predominantly carried by a single frequency $v_{max}$ of the phonon vibrations. The phonon dominant wavelength is then found as $\lambda_{dom}=v/v_{max}$, where v is the speed of sound. Similar to optical filters, by choosing film layer thicknesses that are quarter-wavelength (or an integer number of wavelength plus one quarter wavelength), a phonon filter can be determined where constructive interference at each layer minimizes the heat flow.

Also, using the combination design criteria as discussed above, a multi-layer NS stack can be formed using any number of layers and starting with either an N or an S layer, to minimize the heat flow. Furthermore, the thickness can be minimized by selecting a thickness above the selected coherence length of the superconducting metal and a thickness that is a quarter-wavelength (or the next integer number of wavelengths plus one quarter-wavelength) of the dominant phonon for a given layer based on it material and expected operating temperature, just above the selected coherence length for each metal layer. Also, the particular metal for the superconducting metal layers and normal metal layers can be selected to provide a maximum boundary resistance at each interface.

Figure 2:
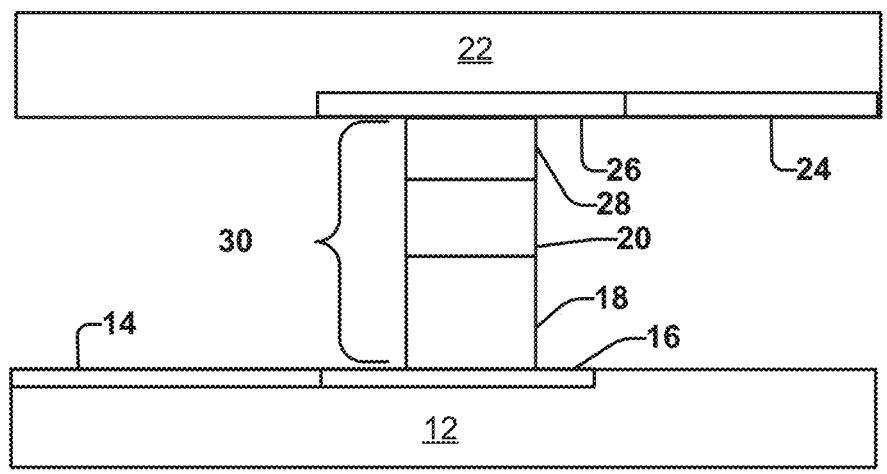
FIG. 2 illustrates a schematic cross-sectional view of a superconductor bump bond structure disposed between two chips.

FIG. 1 illustrates a perspective view of an example of a Chip-on-Chip superconducting structure 10. FIG. 2 illustrates a schematic cross-sectional view of an example superconducting bump bond structure 30 of the superconducting structure 10. The Chip-on-Chip superconducting structure 10 includes a first superconducting device 12 (e.g., bottom device or main device) connected to a second superconducting device 22 (e.g., top device or auxiliary device), through a plurality of superconductor bumps structures 30. A superconducting structure could include multiple superconducting devices connected to another superconducting device. A superconducting device can be a substrate wafer, a package device for passing signals to another device, an integrated circuit (IC), or a variety of other types of superconducting devices.

The first superconducting device 12 includes a plurality of first contact pads 16 disposed on a top side of the first superconducting device 12. The plurality of first superconducting or normal metal contact pads 16 are coupled to conductive lines 14 that electrically couple the plurality of first contact pads 16 to other electrical elements such as vias and/or circuitry within the first superconducting device 12. The second superconducting device 22 includes a plurality of second superconducting or normal metal contact pads 26 disposed on a bottom side of the second superconducting device 22. The plurality of second superconducting contact pads 26 are coupled to conductive lines 24 that electrically couple the plurality of second superconducting contact pads 26 to other electrical elements such as vias and/or circuitry within the second superconducting device 22. The first superconducting device 12 is electrically and mechanically coupled to the second superconducting device 22 by a plurality of superconducting bump bond structures 30 that bond the devices to one another through corresponding superconducting contact pads of the first and second superconducting structures 12 and 22, respectively. The superconducting bump bond structure also acts as a thermal isolator between the chips by utilizing a superconducting bump bond structure of interleaving superconducting and normal metal layers.

Referring to FIG. 2, the superconducting bump bond structure 30 is formed of a first normal metal layer 18 that overlies a given first superconducting contact pad of the plurality of first superconducting contact pads 16, a second normal metal layer 28 that overlies a given second superconducting contact pad of the plurality of second superconducting contact pads 26, and a superconducting metal layer 20 that couples the first normal metal layer 18 to the second normal metal layer 28. The first normal metal layer 18 and the second normal metal layer 28 can be formed of a normal metal such as gold, platinum, or a metal that is above its superconducting transition temperature, such as titanium or chromium, or a combination thereof. The superconducting metal layer can be formed of niobium, aluminum, or some other superconducting metal. Furthermore, the superconducting metal material of the superconducting metal layer 20, and the normal metal material of the first normal metal layer 18 and the second normal metal layer 28 are selected to provide a good thermal boundary resistance at each normal metal layer and superconducting material layer interface to inhibit the flow of heat. The thickness of each metal layer can be selected to be greater than a thickness of at least 2 coherence lengths of the type of superconducting metal in the superconducting metal layer 20 to assure that the superconducting metal layer 20 retains its superconducting properties, and that the first normal metal layer 18 and the second normal metal layer 20 retains its normal metal properties.

Figure 3:
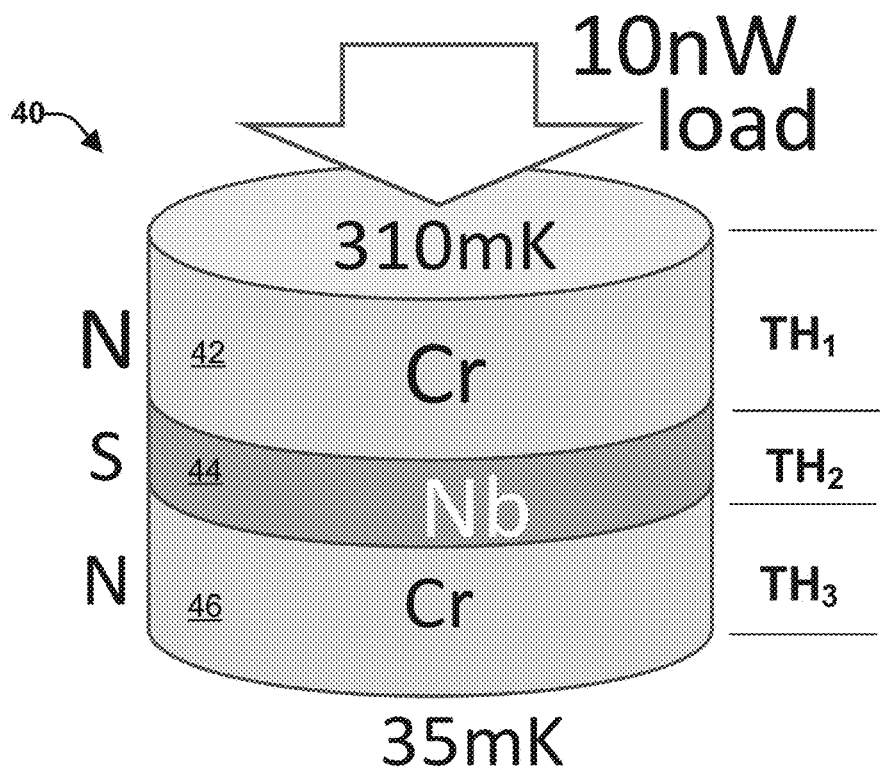
FIG. 3 illustrates a perspective view of an example bump bond structure.

FIG. 3 illustrates an example of a bump bond structure 40 that also acts as a thermal isolator between bonded devices. A superconducting metal layer 44 is sandwiched between a first normal metal layer 42 and a second normal metal layer 46. The superconducting metal layer 44 is formed of niobium, and the first normal metal layer 42 and the second normal metal layer 46 are formed of chromium. Niobium and chromium provide a good thermal boundary resistance between each normal metal layer and superconducting metal layer interface. The first normal metal layer 42 has a thickness of TH1, the superconducting metal layer 44 has a thickness of TH2, and the second normal metal layer 46 has a thickness TH3. Each of the thickness are selected to be at least 2 coherence lengths of niobium (e.g., about 2 to about 5) which is at least (48 nm*2) or at least 96 nm thick, so that the niobium behaves as a superconductor and so that the chromium behaves as a normal metal. As illustrated in FIG. 3, a 10 nanoWatts (nW) load creates a maximum temperature of 310 millikelvin (mK) at the first normal metal layer 42 thermally isolated from the second normal metal layer 46 at a minimum temperature of 35 mK. The superconducting metal layer 44 has an operating temperature in between the maximum and minimum temperatures. The thickness of each metal layer is selected to allow for the necessary amount of temperature drop between each layer and desired thermal isolation between ends of the bump bond structure 40.

For example, the thickness of each metal layer can be selected to be a quarter-wavelength or an integer number of wavelengths plus one quarter-wavelength of the phonon dominant wavelength for the respective metal layer based on the metal material and its expected operating temperature of the respective metal layer during normal operation of the bonded devices to facilitate temperature isolation between the bonded devices. The thicknesses will be larger to handle the larger temperature drops between metal layers when only a few layers are used as opposed to the thicknesses being smaller and having smaller temperature drops when more layers are used to form the bump bond structure due to having more superconducting/normal metal interfaces.

Figure 4:
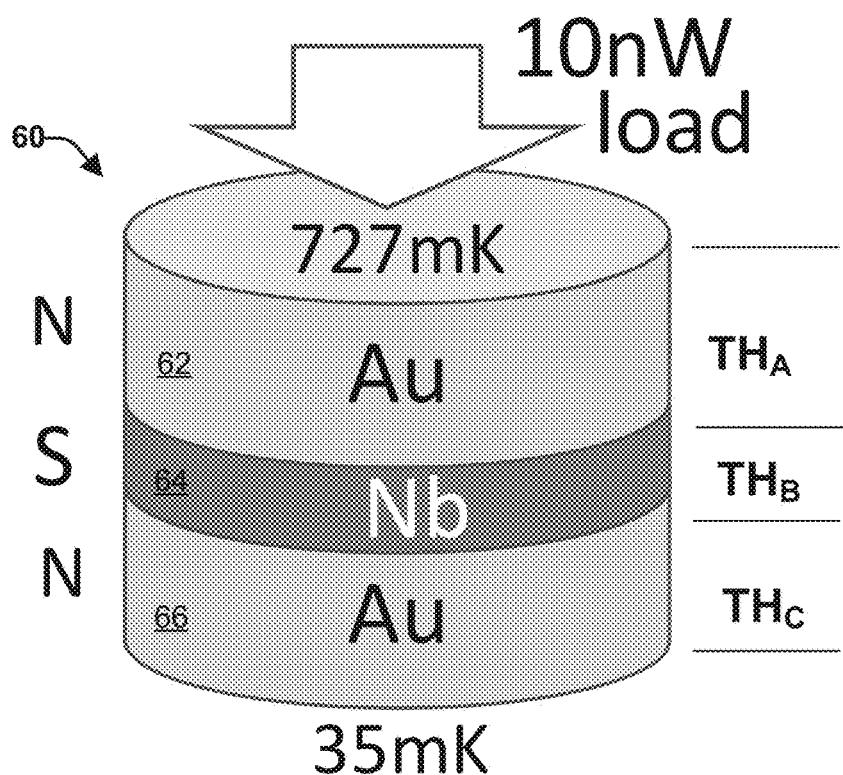
FIG. 4 illustrates a perspective view of another example bump bond structure.

FIG. 4 illustrates another example of a bump bond structure 60 that also acts as a thermal isolator between bonded devices. A superconducting metal layer 64 is sandwiched between a first normal metal layer 62 and a second normal metal layer 66. The superconducting metal layer 64 is formed of niobium, and the first normal metal layer 62 and the second normal metal layer 66 are formed of gold. Gold and niobium provide a good thermal boundary resistance between each normal metal layer and superconducting metal layer interface. The first normal metal layer 62 has a thickness of $TH_A$, the superconducting metal layer 64 has a thickness of $TH_B$, and the second normal metal layer 66 has a thickness $TH_C$. Each of the thickness are selected to be at least 2 coherence lengths of niobium (e.g., about 2 to about 5), which is at least (48 nm*2) or at least 96 nm thick, so that the niobium behaves as a superconductor and so that the gold behaves as a normal metal. As illustrated in FIG. 3, a 10 nW load creates a maximum temperature of 727 mK at the first normal metal layer 62 thermally isolated from the second normal metal layer 66 at a minimum temperature of 35 mK. The superconducting metal layer 64 has an operating temperature in between the maximum and minimum temperatures. The thickness of each metal layer is selected to allow for the necessary amount of temperature drop between each layer and desired thermal isolation between ends of the bump bond structure 40.

Again, the thickness of each metal layer can be selected to be a quarter-wavelength or integer multiple quarter-wavelength of the phonon dominant wavelength for the respective metal layer based on the metal material and its expected operating temperature of the respective metal layer during normal operation of the bonded devices to facilitate temperature isolation between the bonded devices.

Figure 5:
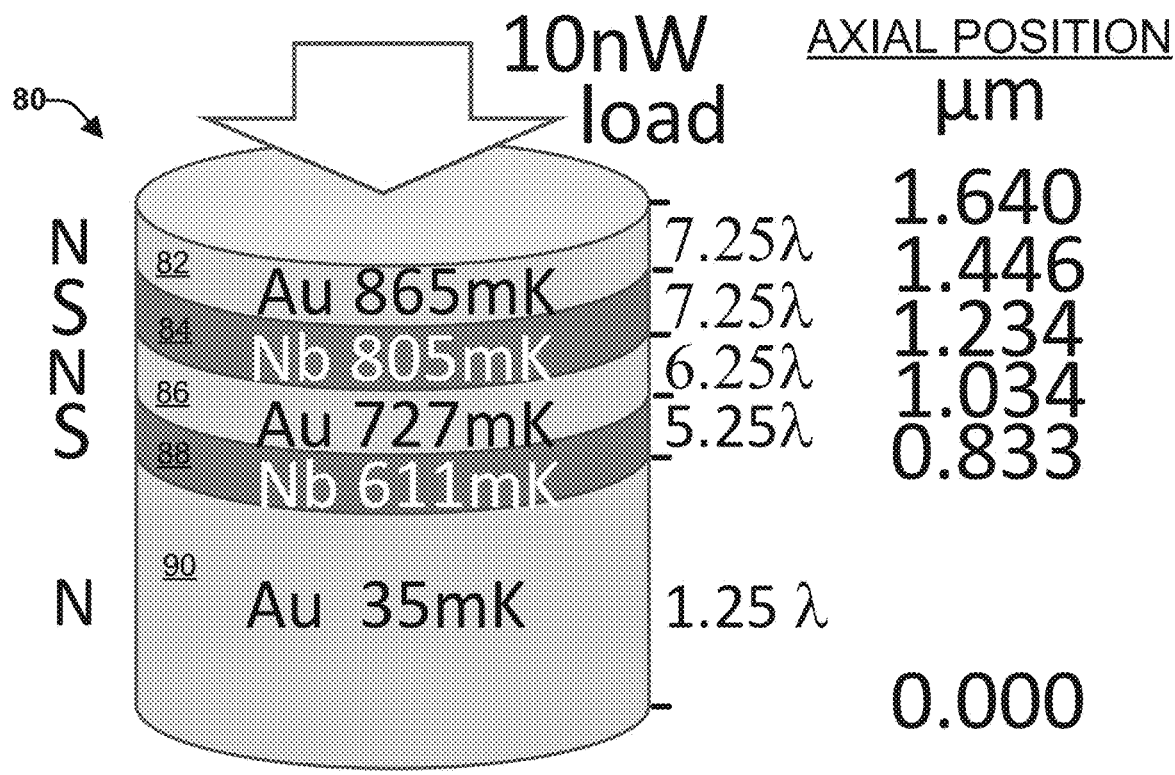
FIG. 5 illustrates a perspective view of yet another example bump bond structure.

FIG. 5 illustrates another example of a bump bond structure 80 that also acts as a thermal isolator. The bump bond structure 80 includes a plurality of normal metal layers and a plurality of superconducting metal layers interleaved with one another. A first superconducting metal layer 84 is sandwiched between a first normal metal layer 82 and a second normal metal layer 86, and a second superconducting metal layer 88 is sandwiched in between the second normal metal layer 86 and a third normal metal layer 90. The example of FIG. 5 illustrates a bump bond structure with three normal metal layers and two superconducting material layers but any number of interleaved normal metal layers and superconducting layer can be employed as long as it is mechanically feasible. The first and second superconducting metal layers 84 and 88 are formed of niobium, and the first, second and third normal metal layers 82, 86, and 90 are formed of gold. Gold and niobium provide a good thermal boundary resistance between each normal metal layer and superconducting metal layer interface.

As illustrated in FIG. 5, a 10 nW load creates a maximum temperature of 865 mK at the first normal metal layer 82 thermally isolated from the third normal metal layer 90 at a minimum temperature of 35 mK. The thickness of each metal layer is selected to allow for the necessary amount of temperature drop for each layer based on the maximum temperature to the minimum temperature. The operating temperature of the first superconducting metal layer 84 drops to 805 mK, the temperature of the second normal metal layer 86 drops to 727 mK, and the temperature of the second superconducting layer 88 drops to 611 mK.

In the example, of FIG. 5, each of the thickness are selected to be at least four coherence lengths of niobium (48 nm*4) or at least 192 nm thick, so that the niobium behaves as a superconductor and so the gold behaves as a normal metal. Again to provide for further temperature isolation, the thickness of each metal layer is selected to be a quarter-wavelength or an integer number of wavelengths plus one quarter-wavelength of the phonon dominant wavelength of each given layer based on the metal material and its expected operating temperature of the respective metal layer during normal operation of the bonded devices to facilitate temperature isolation between the bonded devices.

The first normal metal layer 82 is shown to operate at a temperature of 865 mK. The phonon dominant wavelength for gold at 865 mK is about 26.7 nm. Therefore, the thickness of the next multiple of quarter-wavelength should be greater than 192 nm thick to achieve four Nb coherence lengths at 48 nm each. Given that 192 nm divided by 26.7 nm is about 7.19, then the selection of 7.25 wavelengths would be the next multiple of quarter-wavelength to give the minimum thickness of 0.194 micrometers to achieve the desired criteria. The first superconducting layer 84 is shown to operate at a temperature of 805 mk. The phonon dominant wavelength for niobim at 805 mK is about 29.24 nm. Therefore, the thickness of the next multiple of quarter-wavelength should be greater than 192 nm thick for a Nb coherence length of 48 nm. Given that 192 nm divided by 29.24 nm is about 6.57, then the selection of 7.25 wavelengths would be the next multiple of quarter-wavelength to give the minimum thickness of 0.212 micrometers to achieve the desired criteria.

The second normal metal layer 86 is shown to operate at a temperature of 727 mK. The phonon dominant wavelength for gold at 727 mK is about 32 nm. Given that 192 nm divided by 32 nm is 6, then the selection of 6.25 wavelengths would be the next multiple of quarter-wavelength to give the minimum thickness of 0.2 micrometers to achieve the desired criteria. The second superconducting layer 84 is shown to operate at a temperature of 611 mK. The phonon dominant wavelength for niobim at 611 mK is about 38.2 nm. Given that 192 nm divided by 38.2 nm is about 5.026, then the selection of 5.25 wavelengths would be the next multiple of quarter-wavelength to give the minimum thickness of 0.201 micrometers to achieve the desired criteria. Finally, the third normal metal layer 90 is shown to operate at a temperature of 35 mK. The phonon dominant wavelength for gold at 35 mK is about 666 nm. Given that 192 nm divided by 666 nm is 0.288, then the selection of 1.25 wavelengths would be the next multiple of quarter-wavelength to give the minimum thickness of 0.833 micrometers to achieve the desired criteria.

Figure 6:
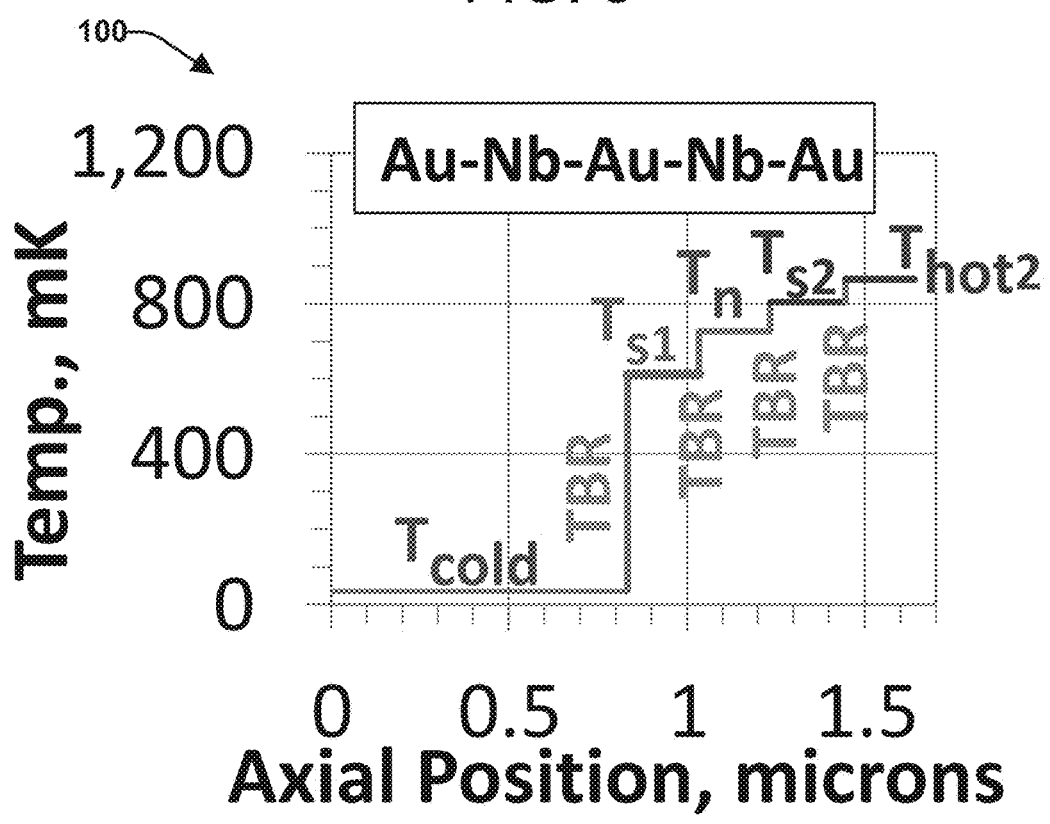
FIG. 6 illustrates a graph of axial position versus temperature of the bump bond structure of FIG. 5.

FIG. 6 illustrates a graph of Axial Position (microns) versus Temperature (mK) of the bump bond structure of FIG. 5 during normal operation of the bonded device. The axial position at the X-axis starts at 0 at the bottom of the third normal metal layer 90 and ends at the top of the first normal metal 82. The temperature along the Y-axis of the graph starts at the third normal metal layer 90 to the first normal metal layer 82. As seen in the graph 100, the temperature and axial position move along in a step-wise manner from the cold chip to the hotter chip with temperature changes through each metal layer which causes temperature isolation between layers due to the boundary resistance of each superconducting metal layer and normal layer interface, along with the selection of thicknesses that are a quarter-wavelength or multiple quarter wavelength of the phonon dominate wavelength of each respective metal layer.

For purposes of simplification of explanation the terms "overlay", "overlaying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation are for purposes of illustration. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A superconducting structure comprising:
   a first superconducting device having a plurality of first contact pads disposed on a top side of a first superconducting device;
   a second superconducting device having a plurality of second contact pads disposed on a bottom side of a second superconducting device; and
   a plurality of superconducting bump bond structures with a given superconducting bump bond structure coupling respective contact pads of the plurality of first contact pads and the plurality of second contact pads to one another to bond the first superconducting device to the second superconducting device, each of the plurality of superconducting bump bond structures comprising:
      a first normal metal layer disposed on the top surface of a given one of the plurality of first superconducting contact pads;
      a second normal metal layer disposed on the top surface of a given one of the plurality of second superconducting contact pads; and
      a superconducting metal layer disposed between the first normal metal layer and the second normal metal layer, wherein the metal thicknesses of each of the first normal metal layer, the second normal metal layer, and the specific material of the superconducting metal and the normal metal are selected to inhibit the transfer of heat between the first superconducting device and the second superconducting device.

2. The superconducting structure of claim 1, wherein the metal thicknesses of each of the first normal metal layer, the second normal metal layer and the superconducting metal have a thickness of greater or equal to two coherence lengths of the superconducting metal.

3. The superconducting structure of claim 2, wherein the metal thicknesses of each of the first normal metal layer, the second normal metal layer and the superconducting metal have a thickness of about two coherence lengths to about five coherence lengths of the superconducting metal.

4. The superconducting structure of claim 1, wherein the metal thicknesses of each of the first normal metal layer, the second normal metal layer and the superconducting metal have a respective thickness substantially equal to a quarter-wavelength or an integer number of wavelengths plus one quarter-wavelength of the phonon dominant wavelength associated with the respective metal layer that is based on the type of metal material and its specific temperature during normal operation to provide constructive reflection in each layer to minimize heat flow.

5. The superconducting structure of claim 1, wherein the first normal metal layer, and the second normal metal layer are formed of the same normal metal.

6. The superconducting structure of claim 5, wherein the superconducting material of the superconducting material layer and the same normal metal are selected to produce a good thermal boundary resistance due to the different speed of sound responses of the respective material.

7. The superconducting structure of claim 6, wherein the superconducting material is niobium and the same normal metal is gold.

8. The superconducting structure of claim 6, wherein the superconducting material is niobium and the same normal metal is chromium.

9. The superconducting structure of claim 1, wherein each of the plurality of superconducting bump bond structures comprises at least one additional superconducting material layer and at least one additional normal metal layer, such that the superconducting material layers are interleaved with the normal metal layers.

10. The superconducting structure of claim 1, wherein the superconducting metal layer is formed from one of indium, niobium and aluminum.

11. The superconducting structure of claim 1, wherein the normal metal layer are formed from one of gold, titanium, chromium, platinum, or a combination thereof.

12. A superconducting structure comprising:
   a first superconducting device having a plurality of first contact pads disposed on a top side of a first superconducting device;
   a second superconducting device having a plurality of second contact pads disposed on a bottom side of a second superconducting device; and
   a plurality of superconducting bump bond structures with a given superconducting bump bond structure coupling respective contact pads of the plurality of first contact pads and the plurality of second contact pads to one another to bond the first superconducting device to the second superconducting device, each of the plurality of superconducting bump bond structures comprising:
a plurality of normal metal layers and a plurality of superconducting metal layers interleaved with one another wherein the metal thicknesses of each of the plurality of normal metal layers and the plurality of superconducting metal layers are selected to have a thickness of greater or equal to two coherence lengths of the superconducting metal.

13. The superconducting structure of claim 12, wherein the metal thicknesses of each of the plurality of normal metal layers and the plurality of superconducting metal layers have a thickness of about two coherence lengths to about five coherence lengths of the superconducting metal.

14. The superconducting structure of claim 12, wherein the metal thicknesses of each of the plurality of normal metal layers and the plurality of superconducting metal layers have a respective thickness substantially equal to a quarter-wavelength or an integer number of wavelengths plus one quarter-wavelength of the phonon dominant wavelength associated with the respective metal layer that is based on its type of metal material and its temperature during normal operation to provide constructive reflection in each layer to minimize heat flow.

15. The superconducting structure of claim 12, wherein the each of the plurality of normal metal layers are formed of the same normal metal material and each of the plurality of superconducting metal layers are formed of the same superconducting metal material.

16. The superconducting structure of claim 15, wherein the same normal metal material and the same superconducting material are selected to produce a good thermal boundary resistance at each normal metal layer and superconducting metal layer interface due to the different speed of sound responses of the respective material.

17. The superconducting structure of claim 16, wherein the superconducting material is niobium and the same normal metal is gold.

18. The superconducting structure of claim 16, wherein the superconducting material is niobium and the same normal metal is chromium.

19. The superconducting structure of claim 12, wherein the superconducting metal layer is formed from one of indium, niobium and aluminum.

20. The superconducting structure of claim 12, wherein the normal metal layer are formed from one of gold, titanium, chromium, platinum, or a combination thereof.

* * * * *